(12) United States Patent
Jung et al.

(10) Patent No.: US 9,668,344 B2
(45) Date of Patent: May 30, 2017

(54) SEMICONDUCTOR PACKAGES HAVING INTERCONNECTION MEMBERS

(71) Applicant: SK hynix Inc., Icheon-si, Gyeonggi-do (KR)

(72) Inventors: Won Duck Jung, Icheon-si (KR); Jong Ho Lee, Icheon-si (KR); Joo Hyun Kang, Seoul (KR); Chong Ho Cho, Incheon (KR); In Chul Hwang, Seoul (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 14/878,891

(22) Filed: Oct. 8, 2015

(65) Prior Publication Data

US 2016/0316559 A1    Oct. 27, 2016

(30) Foreign Application Priority Data

Apr. 23, 2015  (KR) .................. 10-2015-0057564
May 11, 2015  (KR) .................. 10-2015-0065618

(51) Int. Cl.

| H05K 7/00 | (2006.01) |
|---|---|
| H05K 7/12 | (2006.01) |
| H05K 1/11 | (2006.01) |
| H01L 27/115 | (2017.01) |
| H05K 1/14 | (2006.01) |
| H05K 3/32 | (2006.01) |

(52) U.S. Cl.
CPC ............ *H05K 1/111* (2013.01); *H01L 27/115* (2013.01); *H05K 1/145* (2013.01); *H05K 3/32* (2013.01); *H05K 2201/09209* (2013.01); *H05K 2201/1078* (2013.01); *H05K 2201/10159* (2013.01); *H05K 2201/10287* (2013.01); *H05K 2201/10613* (2013.01); *H05K 2201/10757* (2013.01)

(58) Field of Classification Search
CPC ......... H05K 1/111; H05K 2201/09209; H05K 2201/09372; H05K 2201/09379; H05K 2201/0939
See application file for complete search history.

(56) References Cited

U.S. PATENT DOCUMENTS

| 5,926,951 A * | 7/1999 | Khandros | ............ G01R 1/0466 174/261 |
| 6,287,126 B1 * | 9/2001 | Berger | ............ H01R 4/64 439/65 |

FOREIGN PATENT DOCUMENTS

KR    10-2014-0007641 A    1/2014

* cited by examiner

*Primary Examiner* — Hoa C Nguyen
(74) *Attorney, Agent, or Firm* — William Park & Associates Ltd.

(57) ABSTRACT

A semiconductor package may include a first substrate including a first connection portion disposed on a surface of the first substrate and a second substrate including a second connection portion disposed on a surface of the second substrate. The second substrate may be disposed over the first substrate and the second connection portion facing the first connection portion. A first connection loop portion may be provided to include an end connected to the first connection portion. A second connection loop portion may be provided to include one end connected to the second connection portion and the other end combined with the first connection loop portion.

13 Claims, 22 Drawing Sheets

SEMICONDUCTOR PACKAGES HAVING INTERCONNECTION MEMBERS

CROSS-REFERENCE TO RELATED APPLICATION

The present application claims priority under 35 U.S.C. 119(a) to Korean Application Nos. 10-2015-0057564 and 10-2015-0065618, filed on Apr. 23, 2015 and May 11, 2015, respectively, in the Korean intellectual property Office, which are incorporated herein by references in their entirety.

BACKGROUND

1. Technical Field

Various embodiments of the present disclosure generally relate to a packaging technology and, more particularly, to semiconductor packages employing interconnection members.

2. Related Art

Semiconductor packages which are capable of processing a large amount of data are increasingly in demand with the development of smaller electronic systems such as mobile systems. In response to such a demand, it may be necessary to increase the integration density of semiconductor devices used in the electronic systems. Also, as the interest in the portable and wearable electronics increases, so does the demand for flexible electronic system properties. The flexibility of electronic components such as semiconductor packages constituting the electronic systems has, as a result, also been in demand.

The semiconductor chip may be fabricated to have a thickness appropriate for warpage, and a package substrate on which the semiconductor chip is mounted may also be formed to have a thickness appropriate for warpage. Thus, the possibility of realizing flexible semiconductor packages has been gradually increasing. Accordingly, a lot of effort has been focused on developing techniques that make interconnection structures which electrically connect the chips of the semiconductor devices to each other, electrically connects the chips of the semiconductor devices to a package substrate, or electrically connects substrates to each other even when the chip or substrate of the semiconductor devices is bent or warped.

SUMMARY

According to an embodiment, there is provided a semiconductor package. The semiconductor package may include a first substrate including a first connection pad disposed on a surface thereof and a second substrate including a second connection pad disposed on a surface thereof. The second substrate may be disposed over the first substrate so that the second connection pad faces the first connection pad. A first interconnection member may be provided to include a first pillar portion vertically extending from the second connection pad toward the first substrate, a portion providing a first curved surface extending from the first pillar portion to be concavely bent, a first bending portion extending from the portion providing the first curved surface toward the first pillar portion direction, and a portion providing a first hook surface horizontally extending from the first bending portion toward an inner space of the portion providing the first curved surface. A second interconnection member may be provided to include a second pillar portion vertically extending from the first connection pad toward the second substrate, a portion providing a second curved surface extending from the second pillar portion to be concavely bent, and a portion providing a second hook surface horizontally extending from the portion providing the second curved surface to contact the portion providing the first hook surface of the first interconnection member.

According to an embodiment, there is provided a semiconductor package. The semiconductor package may include a first substrate having a first connection pad disposed on a surface thereof and a second substrate having a second connection pad disposed on a surface thereof. The second substrate may be disposed over the first substrate so that the second connection pad faces the first connection pad. A first interconnection member may be provided to include a portion providing a first curved surface extending from the second connection pad toward the first substrate. A second interconnection member may be provided to include a bending portion. The bending portion may extend from the first connection pad toward the second substrate and may be bent to contact the portion providing the first curved surface of the first interconnection member.

According to an embodiment, there is provided a semiconductor package. The semiconductor package may include a first substrate including a first connection portion disposed on a surface thereof and a second substrate including a second connection portion disposed on a surface thereof. The second substrate may be disposed over the first substrate so that the second connection portion faces the first connection portion. A first connection loop portion may be provided to include an end connected to the first connection portion. A second connection loop portion may be provided to include one end connected to the second connection portion and the other end combined with the first connection loop portion.

According to an embodiment, there is provided a semiconductor package. The semiconductor package may include a first substrate including a first connection portion disposed on a surface thereof and a second substrate including a second connection portion disposed on a surface thereof. The second substrate may be disposed over the first substrate so that the second connection portion faces the first connection portion. A first connection loop portion may be provided to include an end combined with the first connection portion. A second connection loop portion may be provided to include one end combined with the second connection portion and the other end hooked to the first connection loop portion. A flexible buffer layer may be introduced into a space between the first and the second substrates to surround the first and the second connection loop portions.

According to an embodiment, there is provided a memory card including a semiconductor package. The semiconductor package may include a first substrate including a first connection pad disposed on a surface thereof and a second substrate including a second connection pad disposed on a surface thereof. The second substrate may be disposed over the first substrate so that the second connection pad faces the first connection pad. A first interconnection member may be provided to include a first pillar portion vertically extending from the second connection pad toward the first substrate, a portion providing a first curved surface extending from the first pillar portion to be concavely bent, a first bending portion extending from the portion providing the first curved surface toward the first pillar portion direction, and a portion providing a first hook surface horizontally extending from the first bending portion toward an inner space of the portion providing the first curved surface. A second interconnection member may be provided to include a second pillar portion vertically extending from the first connection pad toward the second substrate, a portion providing a second curved surface extending from the second pillar portion to be concavely bent, and a portion providing a second hook surface horizontally extending from the portion providing the second curved surface to contact the portion providing the first hook surface of the first interconnection member.

According to an embodiment, there is provided a memory card including a semiconductor package. The semiconductor package may include a first substrate having a first connection pad disposed on a surface thereof and a second substrate having a second connection pad disposed on a surface thereof. The second substrate may be disposed over the first substrate so that the second connection pad faces the first connection pad. A first interconnection member may be provided to include a portion providing a first curved surface extending from the second connection pad toward the first substrate. A second interconnection member may be provided to include a bending portion. The bending portion may extend from the first connection pad toward the second substrate and may be bent to contact the portion providing the first curved surface of the first interconnection member.

According to an embodiment, there is provided a memory card including a semiconductor package. The semiconductor package may include a first substrate including a first connection portion disposed on a surface thereof and a second substrate including a second connection portion disposed on a surface thereof. The second substrate may be disposed over the first substrate so that the second connection portion faces the first connection portion. A first connection loop portion may be provided to include an end connected to the first connection portion. A second connection loop portion may be provided to include one end connected to the second connection portion and the other end combined with the first connection loop portion.

According to an embodiment, there is provided a memory card including a semiconductor package. The semiconductor package may include a first substrate including a first connection portion disposed on a surface thereof and a second substrate including a second connection portion disposed on a surface thereof. The second substrate may be disposed over the first substrate so that the second connection portion faces the first connection portion. A first connection loop portion may be provided to include an end combined with the first connection portion. A second connection loop portion may be provided to include one end combined with the second connection portion and the other end hooked to the first connection loop portion. A flexible buffer layer may be introduced into a space between the first and the second substrates to surround the first and the second connection loop portions.

According to an embodiment, there is provided an electronic system including a semiconductor package. The semiconductor package may include a first substrate including a first connection pad disposed on a surface thereof and a second substrate including a second connection pad disposed on a surface thereof. The second substrate may be disposed over the first substrate so that the second connection pad faces the first connection pad. A first interconnection member may be provided to include a first pillar portion vertically extending from the second connection pad toward the first substrate, a portion providing a first curved surface extending from the first pillar portion to be concavely bent, a first bending portion extending from the portion providing the first curved surface toward the first pillar portion direction, and a portion providing a first hook surface horizontally extending from the first bending portion toward an inner space of the portion providing the first curved surface. A second interconnection member may be provided to include a second pillar portion vertically extending from the first connection pad toward the second substrate, a portion providing a second curved surface extending from the second pillar portion to be concavely bent, and a portion providing a second hook surface horizontally extending from the portion providing the second curved surface to contact the portion providing the first hook surface of the first interconnection member.

According to an embodiment, there is provided an electronic system including a semiconductor package. The semiconductor package may include a first substrate having a first connection pad disposed on a surface thereof and a second substrate having a second connection pad disposed on a surface thereof. The second substrate may be disposed over the first substrate so that the second connection pad faces the first connection pad. A first interconnection member may be provided to include a portion providing a first curved surface extending from the second connection pad toward the first substrate. A second interconnection member may be provided to include a bending portion. The bending portion may extend from the first connection pad toward the second substrate and may be bent to contact the portion providing the first curved surface of the first interconnection member.

According to an embodiment, there is provided an electronic system including a semiconductor package. The semiconductor package may include a first substrate including a first connection portion disposed on a surface thereof and a second substrate including a second connection portion disposed on a surface thereof. The second substrate may be disposed over the first substrate so that the second connection portion faces the first connection portion. A first connection loop portion may be provided to include an end connected to the first connection portion. A second connection loop portion may be provided to include one end connected to the second connection portion and the other end combined with the first connection loop portion.

According to an embodiment, there is provided an electronic system including a semiconductor package. The semiconductor package may include a first substrate including a first connection portion disposed on a surface thereof and a second substrate including a second connection portion disposed on a surface thereof. The second substrate may be disposed over the first substrate so that the second connection portion faces the first connection portion. A first connection loop portion may be provided to include an end combined with the first connection portion. A second connection loop portion may be provided to include one end combined with the second connection portion and the other end hooked to the first connection loop portion. A flexible buffer layer may be introduced into a space between the first and the second substrates to surround the first and the second connection loop portions.

According to an embodiment, there is provided a semiconductor package. The semiconductor package may include a first substrate including a first connection pad disposed on a surface of the first substrate. The semiconductor package may include a second substrate including a second connection pad disposed on a surface of the second substrate, wherein the second substrate is disposed over the first substrate and the second connection pad facing the first connection pad. The semiconductor package may include a first interconnection member including a first hook surface, the first hook surface coupled to the second connection pad, and a second interconnection member including a second hook surface, the second hook surface coupled to the first connection pad. When a first external force is applied to the second substrate and a second external force is applied to the first substrate a portion of the first hook surface maintains contact with a portion of the second hook surface.

According to an embodiment, there is provided a semiconductor package. The semiconductor package may include a first substrate having a first connection pad disposed on a surface of the first substrate. The semiconductor package may include a second substrate having a second connection pad disposed on a surface of the second substrate, wherein the second substrate is disposed over the first substrate and the second connection pad facing the first connection pad. The semiconductor package may include a first interconnection member including a first curved surface coupled to the second connection pad, and a second interconnection member including a bending portion coupled to the first connection pad. In response to an external force increasing a distance between the first substrate and the second substrate an electrical connection between the first and second substrates are maintained through a connection between the first curved surface and the bending portion.

DETAILED DESCRIPTION

Figure 1:
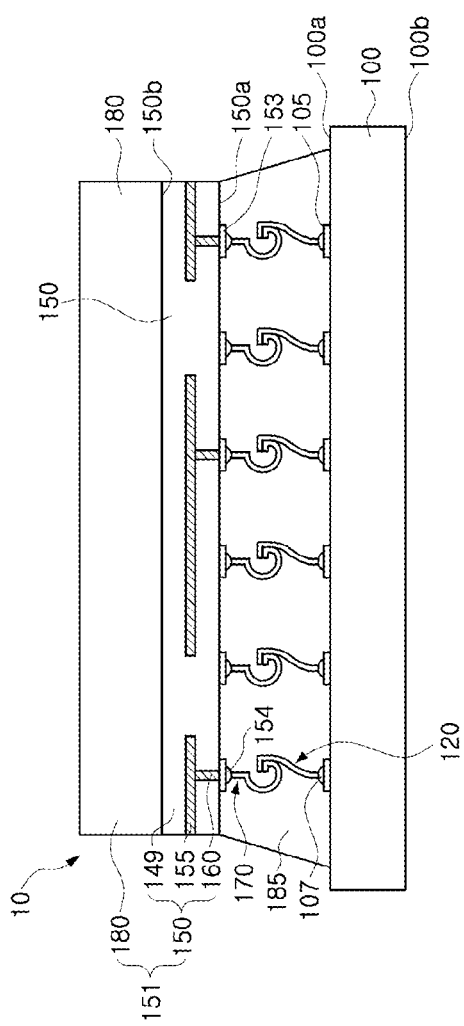
FIG. 1 is a cross-sectional view illustrating a representation of an example of a semiconductor package according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure.

Semiconductor package may include electric devices such as semiconductor chips, and the semiconductor chips may be obtained by separating a semiconductor substrate such as a wafer into a plurality of pieces using a die sawing process. The semiconductor chips may correspond to memory chips or logic chips. The memory chips may include dynamic random access memory (DRAM) circuits, static random access memory (SRAM) circuits, flash circuits, magnetic random access memory (MRAM) circuits, resistive random access memory (ReRAM) circuits, ferroelectric random access memory (FeRAM) circuits or phase change random access memory (PcRAM) circuits which are integrated on and/or in the semiconductor substrate. The logic chips may include logic circuits which are integrated on and/or in the semiconductor substrate. The semiconductor package may be applied to information terminals such as mobile communication devices, electronic systems associated with bio or health care, and wearable electronic systems.

Same reference numerals refer to same elements throughout the specification. Thus, even though a reference numeral is not mentioned or described with reference to a drawing, the reference numeral may be mentioned or described with reference to another drawing. In addition, even though the reference numerals are not illustrated in a drawing, it may be mentioned or described with reference to other drawings.

Figure 2:
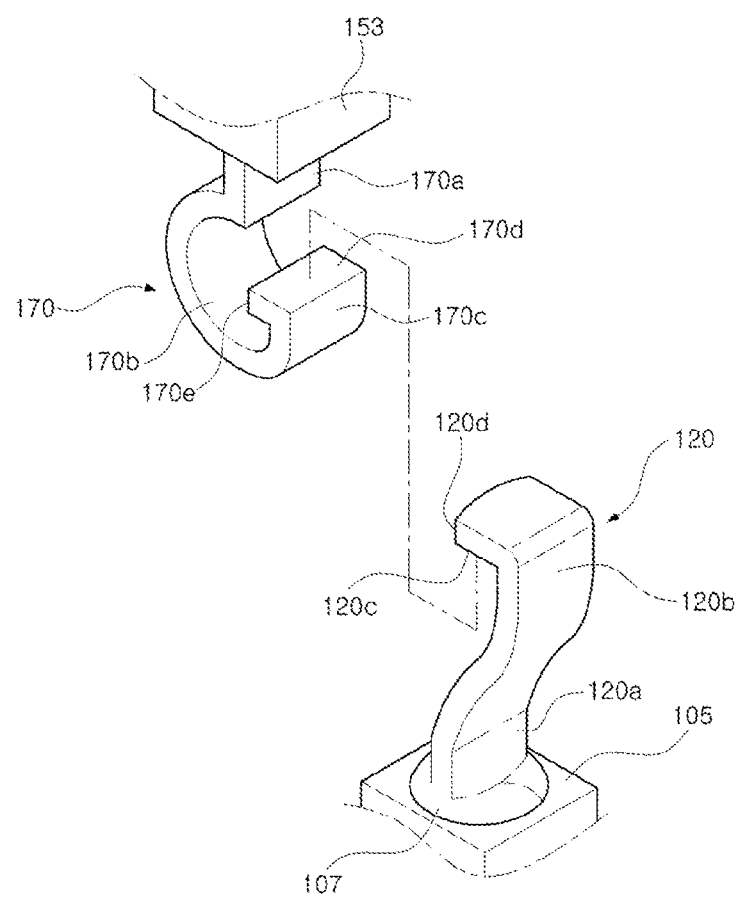
FIGS. 2 and 3 are perspective views illustrating representations of examples of interconnection members of FIG. 1.
Figure 3:
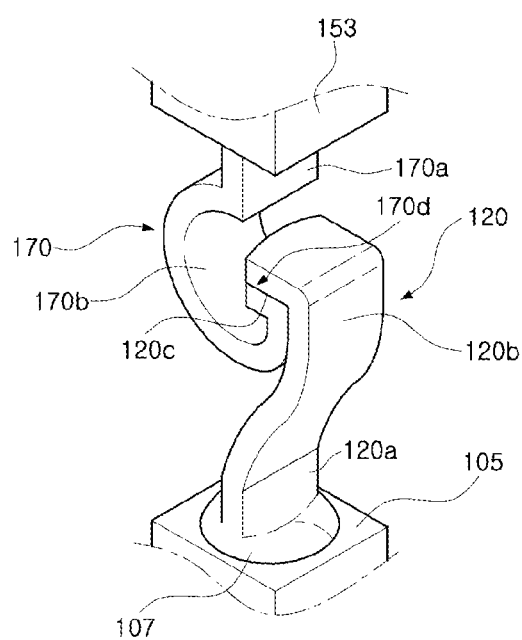

FIG. 1 is a cross-sectional view illustrating a representation of an example of a semiconductor package 10 according to an embodiment, and FIGS. 2 and 3 are perspective views illustrating representations of examples of interconnection members of FIG. 1.

Referring to FIG. 1, the semiconductor package 10 according to an embodiment may include a first substrate 100, a second substrate 151 facing the first substrate 100, and interconnection members 120 and 170 electrically connecting the first substrate 100 to the second substrate 151. The first substrate 100 may be a plate member including a first surface 100a and a second surface 100b that are opposite to each other. A plurality of first connection pads 105 may be disposed spaced apart from each other on the first surface 100a of the first substrate 100. The first connection pads 105 may include aluminum (Al) or copper (Cu). The first substrate 100 may include a printed circuit board (PCB).

The second substrate 151 may be disposed over the first surface 100a of the first substrate 100. The second substrate 151 may include a body 180 and a re-distribution layer 150 disposed below the body 180. The body 180 of the second substrate 151 may include silicon (Si). The re-distribution layer 150 disposed below the body 180 may include inner wiring patterns 155 and via electrodes 160 disposed therein. The re-distribution layer 150 may be a plate member including a first surface 150a and a second surface 150b that are opposite to each other. The re-distribution layer 150 may further include an insulating layer 149 to electrically insulate the inner wiring patterns 155 from each other and to electrically insulate the via electrodes 160 from each other.

The second substrate 151 may have a multi-layered structure. The first surface 150a of the re-distribution layer 150 of the second substrate 151 may be disposed to face the first surface 100a of the first substrate 100. A plurality of second connection pads 153 may be disposed spaced apart from each other on the first surface 150a of the re-distribution layer 150. The second connection pads 153 may include Al or Cu. The inner wiring patterns 155 and the via electrodes 160 connecting the inner wiring patterns 155 to the second connection pads 153 may be disposed in the re-distribution layer 150. Although not illustrated in the drawing, the re-distribution layer 150 may further include other wiring patterns connecting the inner wiring patterns 155 and the via electrodes 160 to the body 180. The inner wiring patterns 155 or the via electrodes 160 may include Cu.

Although not illustrated in the drawing, electronic devices may be disposed on the second substrate 151. The electronic device may be, for example, a semiconductor chip. Alternatively, the electronic device may be a package including a semiconductor chip disposed on another substrate. Although not illustrated in the drawing, the electronic devices (not illustrated) and the second substrate 151 may be electrically connected to each other through conductive members such as metal bumps or metal wires.

The first substrate 100 and the second substrate 151 may be electrically connected to each other through the interconnection members 120 and 170. The interconnection members 120 and 170 may include the first interconnection members 170 connected to the re-distribution layer 150 of the second substrate 151 and the second interconnection members 120 connected to the first substrate 100. Each of the first and the second interconnection members 170 and 120 may be formed of a plate member. Referring to FIGS. 1 and 2, one end of each first interconnection member 170 may be connected to one of the second connection pads 153 through a first contact point 154. Each of the first interconnection members 170 may include a first pillar portion 170a, a portion providing a first curved surface 170b, a first bending portion 170c and a portion providing a first hook surface 170d.

The first pillar portion 170a of the first interconnection member 170 may extend from the second connection pad 153 toward the first substrate 100. The first pillar portion 170a may vertically extend toward the first substrate 100, but the present disclosure is not limited thereto. The portion providing the first curved surface 170b may extend from the first pillar portion 170a and may be concavely bent to have a "C"-shaped vertical cross-section. The bending portion 170c may upwardly extend from the portion providing the first curved surface 170b toward the first pillar portion 170a. The portion providing the first hook surface 170d may horizontally extend or substantially horizontally extend from the first bending portion 170c toward an inner space of the portion providing the first curved surface 170b.

Referring again to FIG. 2, a vertical cross-sectional shape of a part composed of the portion providing the first curved surface 170b, the first bending portion 170c, and the portion providing the first hook surface 170d may have a shape of the alphabet "G". The first interconnection member 170 may include a flexible material capable of being transformed when an external force is applied. In an embodiment, the first interconnection member 170 may include gold (Au), silver (Ag), or copper (Cu).

One end of each second interconnection member 120 may be connected to one of the first connection pads 105 through a second contact point 107. Each of the second interconnection members 120 may include a second pillar portion 120a, a portion providing a second curved surface 120b, and a portion providing a second hook surface 120c. The second pillar portion 120a of the second interconnection member 120 may extend from the first connection pad 105 toward the second substrate 151. The second pillar portion 120a may vertically extend toward the second substrate 151, but the present disclosure is not limited thereto. The portion providing the second curved surface 120b may extend from the second pillar portion 120a to be bent toward the second substrate 151. The portion providing the second hook surface 120c may horizontally extend or substantially horizontally extend from the second curved surface 120b to be bent in the direction opposite to the direction that the portion providing the second curved surface 120b is bent. A vertical cross-sectional shape of a portion including the second pillar portion 120a, the portion providing the second curved surface 120b and the portion providing the second hook surface 120c may have a shape of a letter "⊐". The second interconnection member 120 may include a flexible material capable of being transformed when an external force is applied. In an embodiment, the second interconnection member 120 may include Au, Ag, or Cu.

Referring to FIG. 3 corresponding to a perspective view of the first and second interconnection members 170 and 120 that are combined with each other, the portion providing the first hook surface 170d of the first interconnection member 170 and the portion providing the second hook surface 120c of the second interconnection member 120 may be in contact with each other to provide a combined structure of the first and second interconnection members 170 and 120. A second side surface 120d of the second interconnection member 120 may be vertically aligned with a first side surface 170e of the first interconnection member 170. Also, the first bending portion 170c of the first interconnection member 170 may be disposed to be in contact with the portion providing the second curved surface 120b of the second interconnection member 120.

Referring again to FIG. 1, a space between the first substrate 100 and the second substrate 151 may be filled with a buffer layer 185 including a flexible material capable of being bent when an external force is applied. The flexible material of the buffer layer 185 may include a material having a tensile modulus of elasticity (Young's modulus) of about 0.01 GPa to about 0.1 GPa. In an embodiment, the flexible material may include silicone resin, silicone rubber, or polymer.

When an external force is applied to the semiconductor package 10 so that the first substrate 100 or the second substrate 151 moves up and down or from side to side, the first and second interconnection members 170 and 120 may be bent or transformed to still maintain the electrical connection between the first and second interconnection members 170 and 120. Transformation of the first and second interconnection members 170 and 120 will now be described in detail with reference to FIGS. 4A and 4B.

Figure 4A:
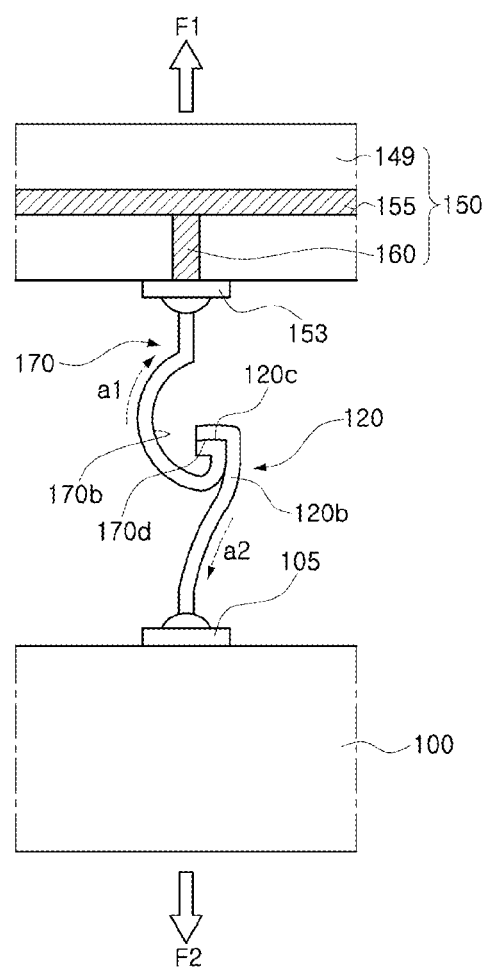
FIGS. 4A and 4B are cross-sectional views illustrating representations of examples of a stress relief action of an interconnection member employed in a semiconductor package according to an embodiment.
Figure 4B:
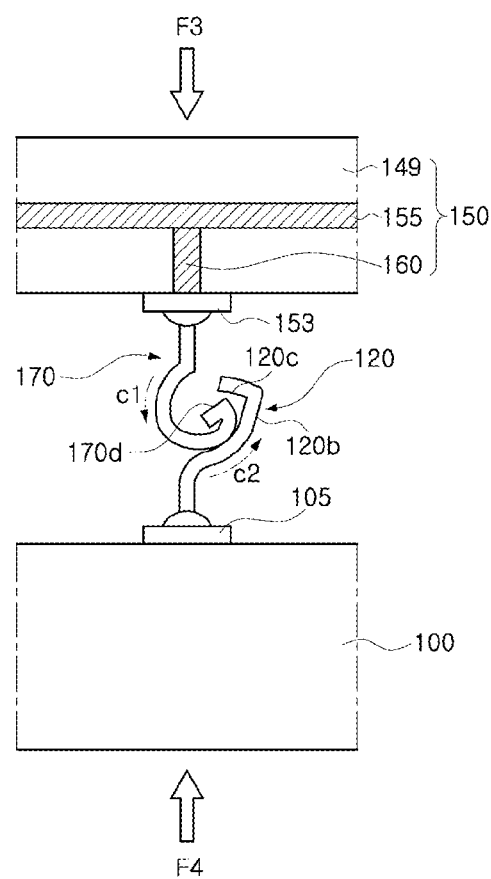

FIGS. 4A and 4B are cross-sectional views illustrating representations of examples of a stress relief action of the interconnection members 170 and 120 employed in the semiconductor package according to an embodiment. Referring to FIG. 4A, when an external force F1 is applied to the re-distribution layer 150 (i.e., the second substrate 151) in an opposite direction to the first substrate 100 and an external force F2 is applied to the first substrate 100 in an opposite direction to the second substrate 151, the portion providing the first curved surface 170b of the first interconnection member 170 may be tensed in a first direction a1 that is the same direction as the first external force F1 as illustrated as an arrow. While the first interconnection member 170 is tensed in the first direction a1, the portion providing the second curved surface 120b of the second interconnection member 120 may be tensed in a second direction a2 that is the same direction as the second external force F2 as illustrated as an arrow. However, even when the external forces F1 and F2 are applied in the opposite directions, the portion providing the first hook surface 170d of the first interconnection member 170 may keep in contact with the second hook surface 120c of the second interconnection member 120 to maintain the electrical connection between the first substrate 100 and the second substrate 151.

Referring to FIG. 4B, even when an external force F3 is applied to the re-distribution layer 150 (i.e., the second substrate 151) toward the first substrate 100 and an external force F4 is applied to the first substrate 100 toward the second substrate 151, the first substrate 100 and the second substrate 151 may also be electrically connected to each other even though the first substrate 100 and the second substrate 151 become closer to each other. For example, the portion providing the first curved surface 170b of the first interconnection member 170 may be compressed in a third direction c1 that is the same direction as the third external force F3, as illustrated by an arrow. While the first interconnection member 170 is compressed in the third direction c1, the portion providing the second curved surface 120b of the second interconnection member 120 may also be compressed in a fourth direction c2 that is the same direction as the fourth external force F4, as illustrated by an arrow. In this example, the portion providing the first hook surface 170d of the first interconnection member 170 may be separated from the portion providing the second hook surface 120c of the second interconnection member 120. However, even when the portion providing the first hook surface 170d is separated from the portion providing the second hook surface 120c, the electrical connection between the first substrate 100 and the second substrate 151 may be maintained because a part of the first interconnection member 170 still keeps in contact with a part of the second interconnection member 120. Accordingly, it may be possible to realize a flexible package that is capable of maintaining the electrical connection between the first and second substrates 100 and 151 due to the presence of the first and second interconnection members 170 and 120 even though an external force is applied to the semiconductor package 10.

Figure 5:
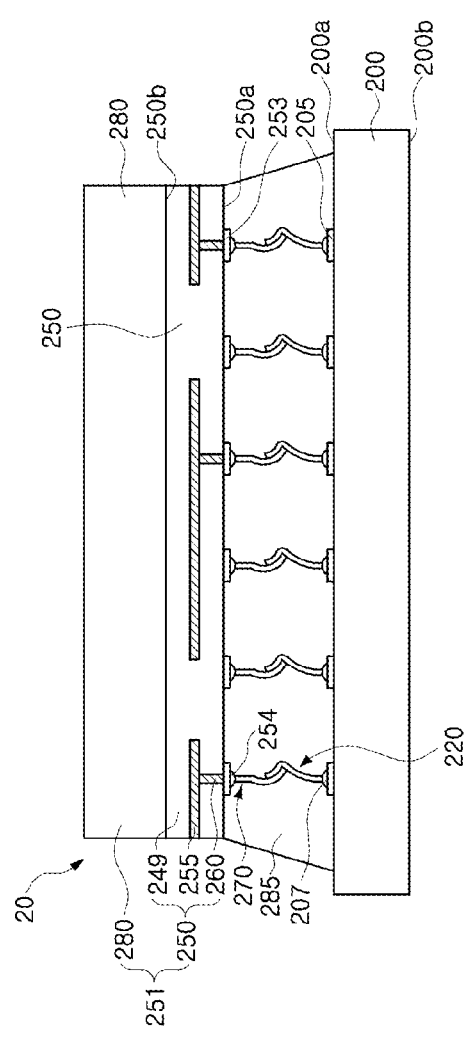
FIG. 5 is a cross-sectional view illustrating a representation of an example of a semiconductor package according to an embodiment.
Figure 6:
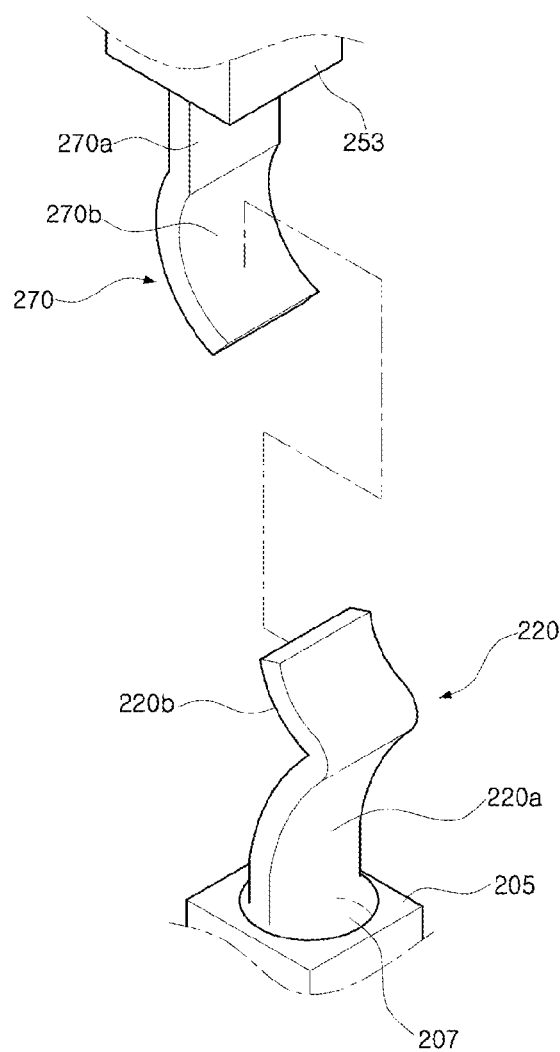
FIGS. 6 and 7 are perspective views illustrating representations of examples of interconnection members of FIG. 5.
Figure 7:
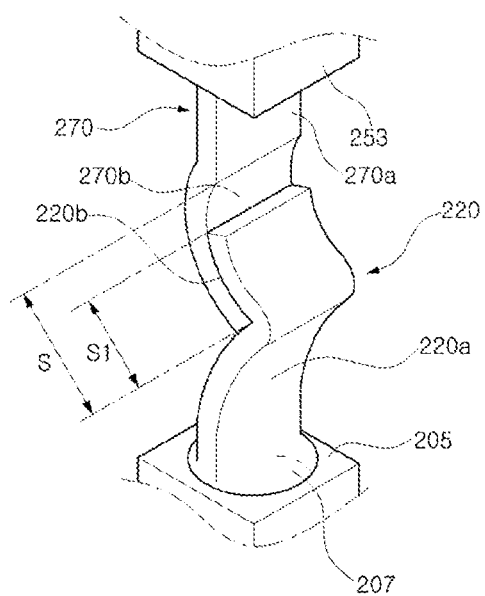

FIG. 5 is a cross-sectional view illustrating a representation of an example of a semiconductor package 20 according to an embodiment. FIGS. 6 and 7 are perspective views illustrating representations of examples of interconnection members of FIG. 5.

Referring to FIG. 5, the semiconductor package 20 may have substantially the same configuration as the semiconductor package 10 illustrated in FIG. 1 except interconnection members 220 and 270. Thus, descriptions of the same elements as set forth with reference to FIG. 1 will be omitted or briefly mentioned in these embodiments.

Referring to FIG. 5, the semiconductor package 20 may include a first substrate 200, a second substrate 251, and the interconnection members 220 and 270 electrically connecting the first substrate 200 to the second substrate 251. The first substrate 200 may include a first surface 200a and a second surface 200b that are opposite to each other. A plurality of first connection pads 205 may be disposed spaced apart from each other on the first surface 200a of the first substrate 200.

The second substrate 251 may be disposed over the first surface 200a of the first substrate 200. The second substrate 251 may include a body 280 and a re-distribution layer 250 disposed below the body 280. The body 280 may include silicon (Si). The re-distribution layer 250 disposed below the body 280 may include inner wiring patterns 255 and via electrodes 260 disposed therein. The re-distribution layer 250 may be a plate member including a first surface 250a and a second surface 250b that are opposite to each other. The re-distribution layer 250 may further include an insulation material layer 249 to electrically insulate the inner wiring patterns 255 from each other and to electrically insulate the via electrodes 260 from each other. In addition, although not illustrated in the drawing, the re-distribution layer 250 may further include other wiring patterns connected to the body 280 through the inner wiring patterns 255 and the via electrodes 260.

A plurality of second connection pads 253 may be disposed spaced apart from each other on the first surface 250a of the re-distribution layer 250 of the second substrate 251. The first or second connection pads 205 or 253 may include Al or Cu. At least one electronic device (not illustrated) including a semiconductor chip may be disposed on the second substrate 251. Although not illustrated in the drawing, the electronic device (not illustrated) and the second substrate 251 may be electrically connected to each other through conductive members such as metal bumps or metal wires.

The first substrate 200 and the second substrate 251 may be electrically connected to each other through the interconnection members 220 and 270. The interconnection members 220 and 270 may include a first interconnection member 270 connected to the re-distribution layer 250 of the second substrate 251 and a second interconnection member 220 connected to the first substrate 200. Each of the first and second interconnection members 270 and 220 may be formed of a plate member.

Referring to FIGS. 5 and 6, one end of each first interconnection member 270 may be connected to one of the second connection pads 253 through a first contact point 254. The first interconnection member 270 may include a first pillar portion 270a and a portion providing a first curved surface 270b. The first pillar portion 270a of the first interconnection member 270 may extend from the second connection pad 253 toward the first substrate 200. The first pillar portion 270a may vertically extend toward the first substrate 200, but the present disclosure is not limited thereto. The portion providing the first curved surface 270b may extend from the first pillar portion 270a toward the first substrate 200 and may be bent to have a parenthesis "("-shaped vertical cross-section. Referring again to FIG. 5, the part including the first pillar portion 270a and the portion providing the first curved surface 270b may have a sickle shaped vertical cross-section.

One end of each second interconnection member 220 may be connected to one of the first connection pads 205 through a second contact point 207. The second interconnection member 220 may include a second pillar portion 220a and a bending portion 220b. The second pillar portion 220a of the second interconnection member 220 may extend from the first connection pad 205 toward the second substrate 251. The second pillar portion 220a may be disposed to have a curved surface that is bent toward the second substrate 251. The bending portion 220b may extend from the second pillar portion 220a and to be bent in a direction opposite to the bending direction of the second pillar portion 220a. The side cross-sectional shape of the portion including the second pillar portion 220a and the bending portion 220b may have a ">"-shaped vertical cross-section. An inner surface of the bending portion 220b of the second interconnection member 220 may be flat. Each of the first and second interconnection members 270 or 220 may include a material capable of being transformed when an external force is applied thereto. In an embodiment, the first and the second interconnection members 270 or 220 may include Au, Ag, or Cu.

A space between the first substrate 200 and the second substrate 251 may be filled with a buffer layer 285 including a flexible material. The flexible material may include a material having a Young's modulus of about 0.01 GPa to about 0.1 GPa. In an embodiment, the flexible material may include silicone resin, silicone rubber, or polymer.

Referring to FIG. 7 corresponding to a perspective view of the first and second interconnection members 270 and 220 that are combined with each other, the portion providing the first curved surface 270b of the first interconnection member 270 and the inner surface of the bending portion 220b of the second interconnection member 220 may be in contact with each other to be electrically connected to each other. In an embodiment, if the first curved surface 270b of the first interconnection member 270 has a first area S, the first and second interconnection members 270 and 220 may be combined with each other so that a contact area of the first curved surface 270b and the bending portion 220b is equal to or greater than half of the first area S.

Even when an external force is applied to the semiconductor package 20 and the first substrate 200 or the second substrate 251 moves up and down or from side to side, the first and the second interconnection members 270 and 220 may be warped or transformed together with the first substrate 200 or the second substrate 251 to suppress that the first or the second interconnection members 270 or 220 are detached from the first substrate 200 or the second substrate 251. In an embodiment, even when an external force is applied to the first substrate 200 and/or the second substrate 251 so that the first substrate 200 increases in distance from the second substrate 251, the electrical connection between the first and second substrates 200 and 251 may be maintained because a contact area of the bending portion 220b of the second interconnection member 220 and the first curved surface 270b of the first interconnection member 270 is greater than half of the first area S of the first curved surface 270b. In addition, if an external force is applied to the first substrate 200 and/or the second substrate 251 so that the first substrate 200 gets closer to the second substrate 251, a contact area between the bending portion 220b of the second interconnection member 220 and the first curved surface 270b of the first interconnection member 270 may increase to still maintain the electrical connection between the first and second substrates 200 and 251.

Figure 8:
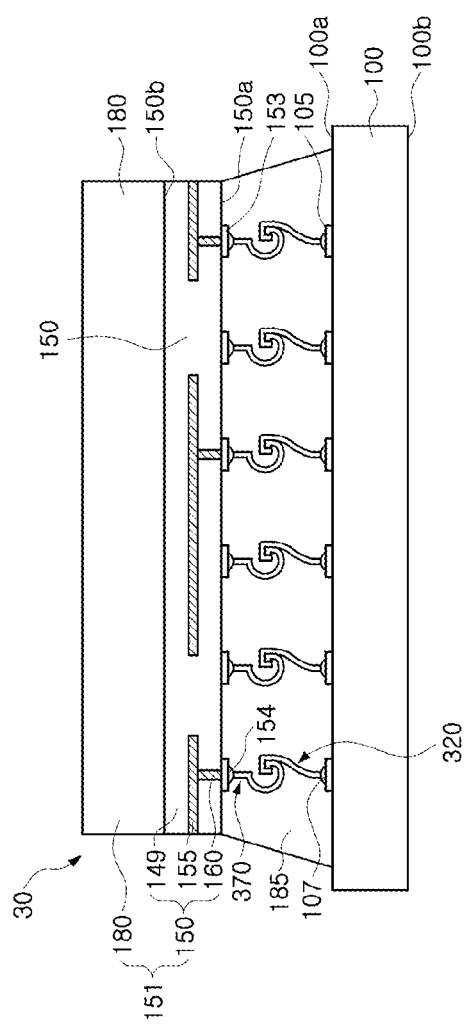
FIG. 8 is a cross-sectional view illustrating a representation of an example of a semiconductor package according to an embodiment.
Figure 9:
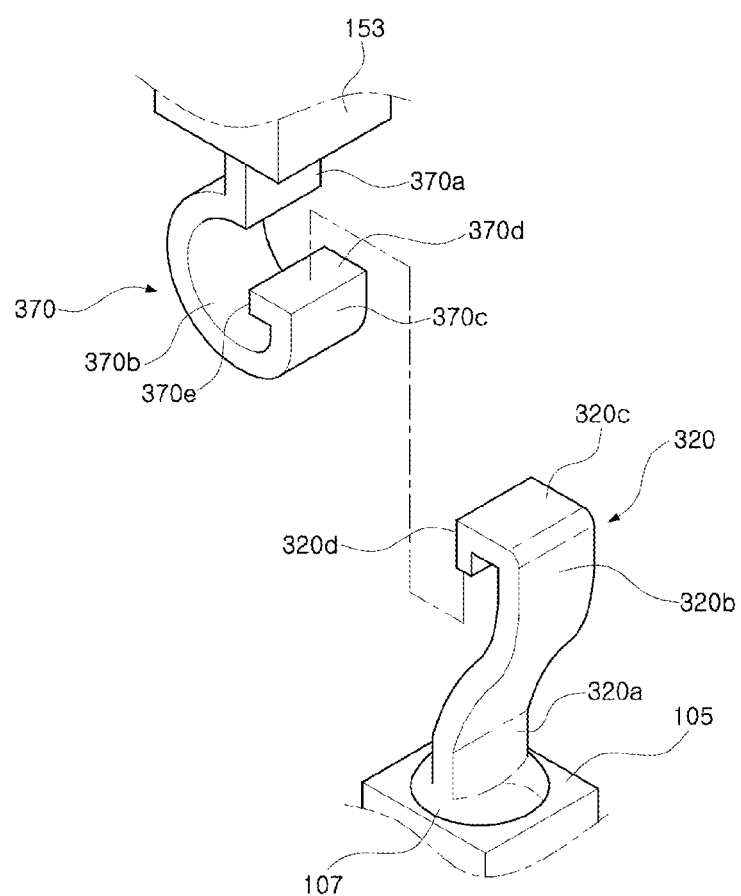
FIGS. 9 and 10 are perspective views illustrating representations of examples of interconnection members of FIG. 8.
Figure 10:
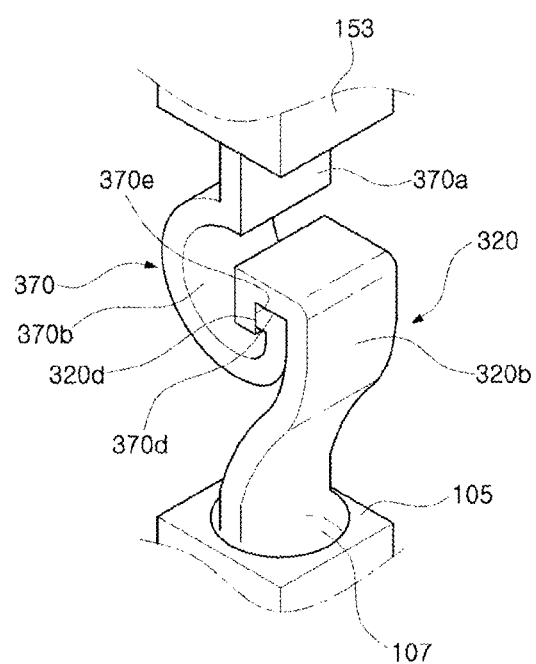

FIG. 8 is a cross-sectional view illustrating a representation of a semiconductor package 30 according to another embodiment. FIGS. 9 and 10 are perspective views illustrating representations of interconnection members of FIG. 8.

Referring to FIGS. 8 and 9, the semiconductor package 30 may have the same configuration as the semiconductor package 10 illustrated in FIG. 1 except interconnection members 320 and 370. Thus, descriptions of the same elements as set forth with reference to FIG. 1 will be omitted or briefly mentioned in this embodiment.

The first substrate 100 and the second substrate 151 disposed to face the first substrate 100 may be electrically connected to each other through the interconnection members 320 and 370. A space between the first substrate 100 and the second substrate 151 may be filled with the buffer layer 185 including a flexible material. The flexible material may include a material having the Young's modulus of about 0.01 GPa to about 0.1 GPa. For example, the buffer layer 185 may include silicone resin, silicone rubber, or polymer. The interconnection members 320 and 370 may include first interconnection members 370 connected to the second substrate 151 and second interconnection members 320 connected to the first substrate 100. Each of the first and the second interconnection members 370 and 320 may be formed of a plate member. One end of each first interconnection member 370 may be connected to the second connection pad 153 through the first contact point 154.

The first interconnection member 370 may include a first pillar portion 370a, a portion providing a first curved surface 370b, a first bending portion 370c, a portion providing a first hook surface 370d, and a portion providing a first sidewall surface 370e. The first pillar portion 370a of the first interconnection member 370 may extend from the second connection pad 153 toward the first substrate 100. The portion providing the first curved surface 370b may extend from the first pillar portion 370a and may be concavely bent to have a "C"-shaped vertical cross-section. The first bending portion 370c may upwardly extend from the portion providing the first curved surface 370b toward the second substrate 151. The portion providing the first hook surface 370d may horizontally extend or substantially horizontally extend from the first bending portion 370c toward an inner space of the portion providing the first curved surface 370b. The first sidewall surface 370e may be defined as a surface of the sidewall extended from the first hook surface 370d. A vertical cross-sectional shape of a portion including the portion providing the first curved surface 370b and the portion providing the first hook surface 370d of the first interconnection member 370 may have a shape of the alphabet "G".

One end of each second interconnection member 320 may be connected to one of the first connection pads 105 through the second contact point 107. The second interconnection member 320 may include a second pillar portion 320a, a portion providing a second curved surface 320b, a portion providing a second hook surface 320c, and a second bending portion 320d. The second pillar portion 320a of the second interconnection member 320 may vertically extend from the first connection pad 105 toward the second substrate 151. The portion providing the second curved surface 320b may extend from the second pillar portion 320a toward the second substrate 151 and may be bent in the outside of the second pillar portion 320a. The portion providing the second hook surface 320c may horizontally extend from or substantially horizontally extend from the portion providing the second curved 320b in the opposite direction to the direction that the portion providing the second curved surface 320b is bent. The second bending portion 320d may vertically extend from the portion providing the second hook surface 320c toward the first substrate 100.

A vertical cross-sectional shape of a portion including the second pillar portion 320a, the portion providing the second curved surface 320b, the portion providing the second hook surface 320c and the second bending portion 320d may have a shape of the number "7". The first or the second interconnection member 370 or 320 may including a material that is capable of being transformed when an external force is applied. In an embodiment, the second interconnection member 320 may include Au, Ag or Cu.

Referring to FIG. 10 corresponding to a perspective view of the first and second interconnection members 370 and 320 that are combined with each other, the portion providing the first hook surface 370d of the first interconnection member 370 may be in contact with and connected to the portion providing the second hook surface 320c. In addition, the portion providing a first sidewall surface 370e of the first interconnection member 370 may be connected to the second bending portion 320d of the second interconnection member 320. Accordingly, the second interconnection member 320 may be in contact with not only the portion providing the first hook surface 370d but also the portion providing the first sidewall surface 370e. In addition, the portion providing the first hook surface 370d of the first interconnection member 370 may be inserted into a groove provided by the portion providing the second curved surface 320b, the portion providing the second hook surface 320c and the second bending portion 320d. Accordingly, even when an external force is applied to the first substrate 100 and/or the second substrate 151, the first interconnection member 370 and the second interconnection member 320 may be electrically connected to each other.

Figure 11:
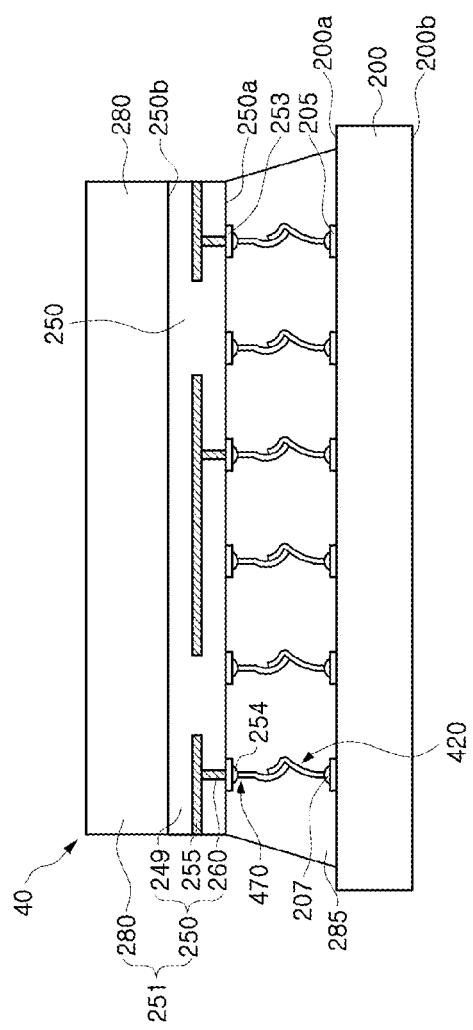
FIG. 11 is a cross-sectional view illustrating a representation of an example of a semiconductor package according to an embodiment.
Figure 12:
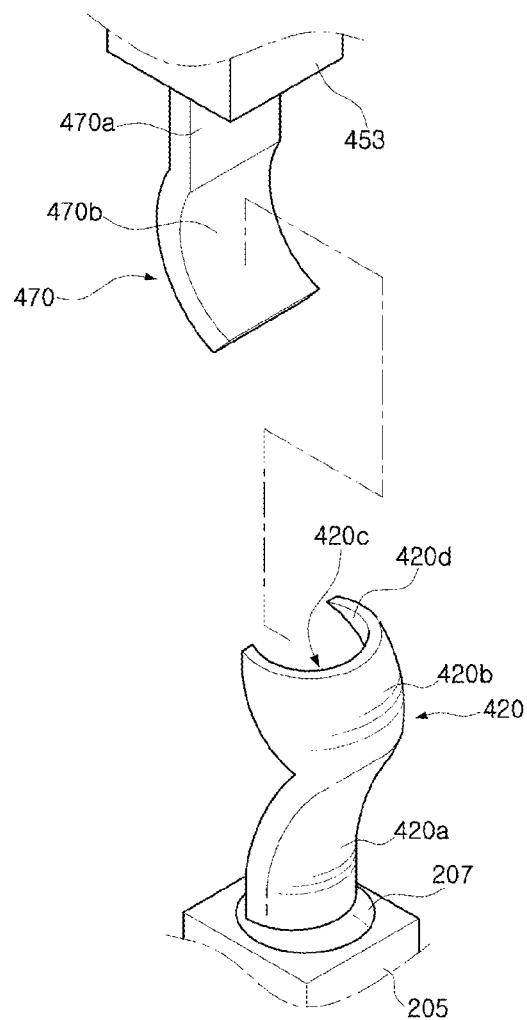
FIGS. 12 and 13 are perspective views illustrating representations of examples of interconnection members of FIG. 11.
Figure 13:
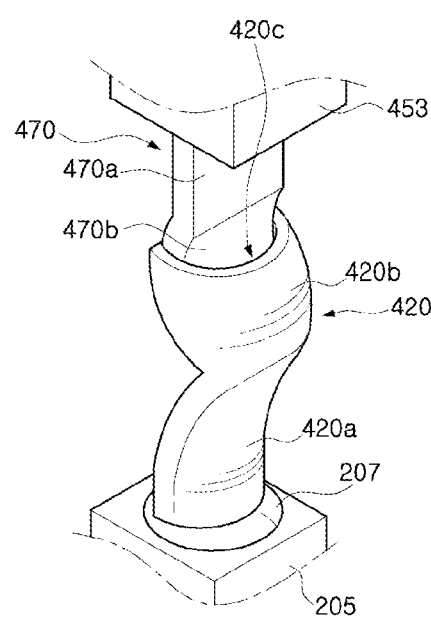

FIG. 11 is a cross-sectional view illustrating a representation of a semiconductor package 40 according to an embodiment. FIGS. 12 and 13 are perspective views illustrating representations of interconnection members of FIG. 11.

Referring to FIGS. 11 and 12, the semiconductor package 40 may have the same configuration as the semiconductor package 20 shown in FIG. 5 except interconnection members 420 and 470. Thus, descriptions of the same elements as set forth with reference to FIG. 5 will be omitted or briefly mentioned in this embodiment.

The first substrate 200 and the second substrate 251 disposed to face the first substrate 200 may be electrically connected to each other through the interconnection members 420 and 470. A space between the first substrate 200 and the second substrate 251 may be filled with a buffer layer 285 including a flexible material. The flexible material may include silicone resin, silicone rubber or polymer. The interconnection members 420 and 470 may include first interconnection members 470 connected to the second substrate 251 and second interconnection members 420 connected to the first substrate 200. Although FIGS. 11, 12 and 13 illustrate an example in which each of the first interconnection members 470 and the second interconnection members 420 is formed of a plate member, the present disclosure is not limited thereto. For example, in some embodiments, the first interconnection member 470 may have a vertical cross-sectional shape of the alphabet "G" like the first interconnection member 170 illustrated in FIG. 1. One end of each first interconnection member 470 may be electrically connected to one of the second connection pads 253 through the first contact point 254.

The first interconnection member 470 may include a first pillar portion 470a and a portion providing a first curved surface 470b providing portion. The first pillar portion 470a may be vertically extend from the second connection pad 453 (i.e., 253 in FIG. 11) toward the first substrate 200, but the present disclosure is not limited thereto. The portion providing the first curved surface 470b may extend from the first pillar portion 470a toward the first substrate 200 and may be concavely bent to have a parenthesis "("-shaped vertical cross-section. Accordingly, a vertical cross-sectional shape of a portion consisting of the first pillar portion 470a and the portion providing the first curved surface 470b may have a sickle shape.

One end of each second interconnection member 420 may be connected to one of the first connection pads 205 through the second contact point 207. The second interconnection member 420 may include a second pillar portion 420a and a bending portion 420b having a groove 420c. The second pillar portion 420a of the second interconnection member 420 may vertically extend from the first connection pad 205 toward the second substrate 251. The second pillar portion 420a may have a curved surface that is bent in a direction of the second substrate 251. The bending portion 420b may extend from the second pillar portion 420a and may be bent in the different direction to the direction that the second pillar portion 420a is bent. The bending portion 420b may include the groove 420c having a concave half circle shape. The first interconnection member 470 or the second interconnection member 420 may include Au, Ag or Cu.

Referring to FIG. 13 corresponding to a perspective view of the first and second interconnection members 470 and 420 that are combined with each other, the first and second interconnection members 470 and 420 that are combined with each other so that the portion providing the first curved surface 470b of the first interconnection member 470 is inserted into the groove 420c of the second interconnection member 420. In such a case, the first curved surface 470b of the first interconnection member 470 may be connected to an inner surface 420d of the groove 420c. When an external force is applied to the semiconductor package 40 so that the first and second substrate 200 and 251 get closer to each other, the first interconnection member 470 and the second interconnection member 420 may be bent or transformed to prevent the first substrate 200 from being electrically disconnected from the second substrate 251. In an embodiment, even when an external force is applied to the first substrate 200 and/or the second substrate 251 so that the first and second substrate 200 and 251 get far from each other, the electrical connection of the first interconnection member 470 and the second interconnection member 420 may be maintained because the first interconnection member 470 is disposed to be in contact with the inner surface 420d of the groove 420c of the second interconnection member 420.

Figure 14:
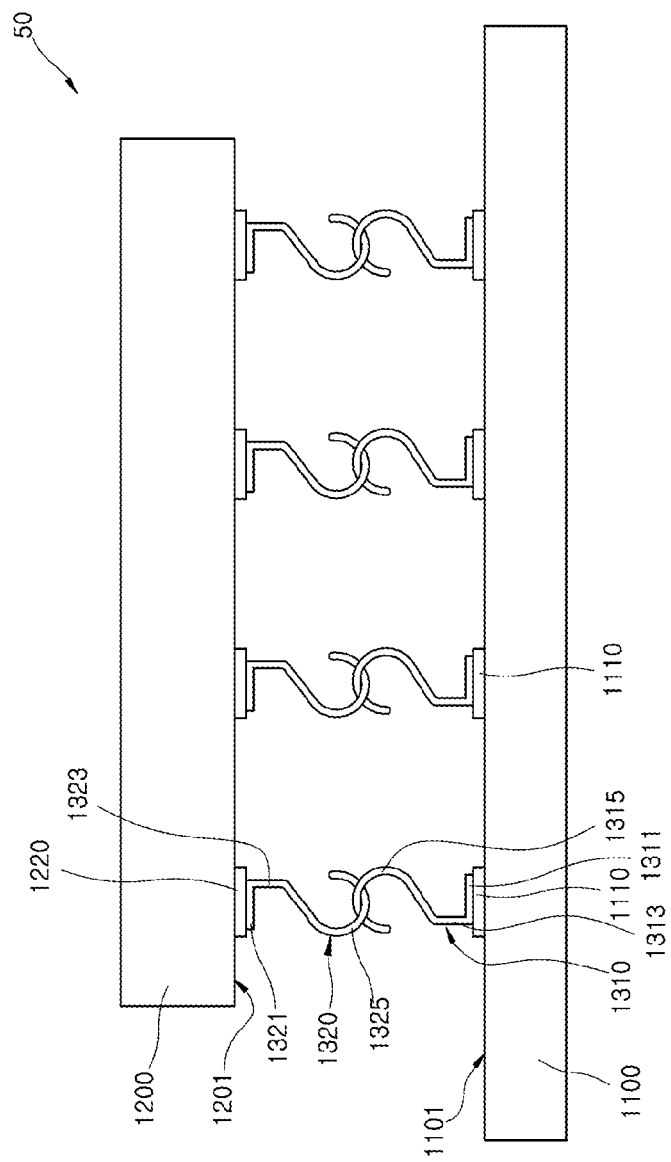
FIG. 14 is a cross-sectional view illustrating a representation of an example of a semiconductor package according to an embodiment.
Figure 15:
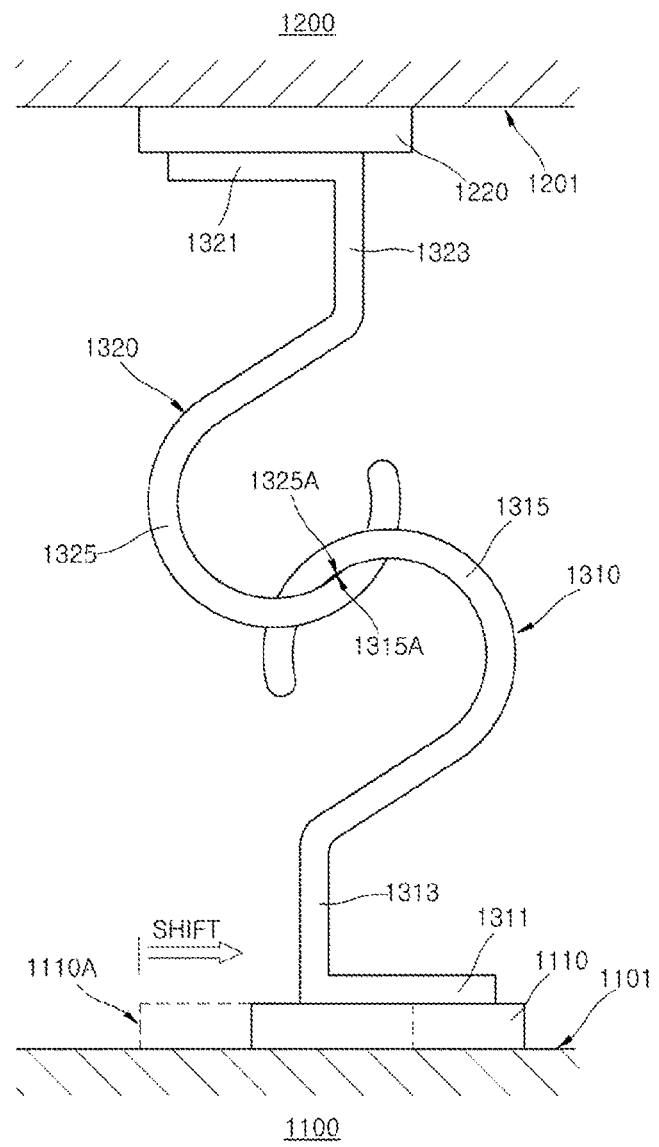
FIGS. 15 and 16 are schematic views illustrating representations of examples of annular interconnection structures of a semiconductor package illustrated in FIG. 14.
Figure 16:
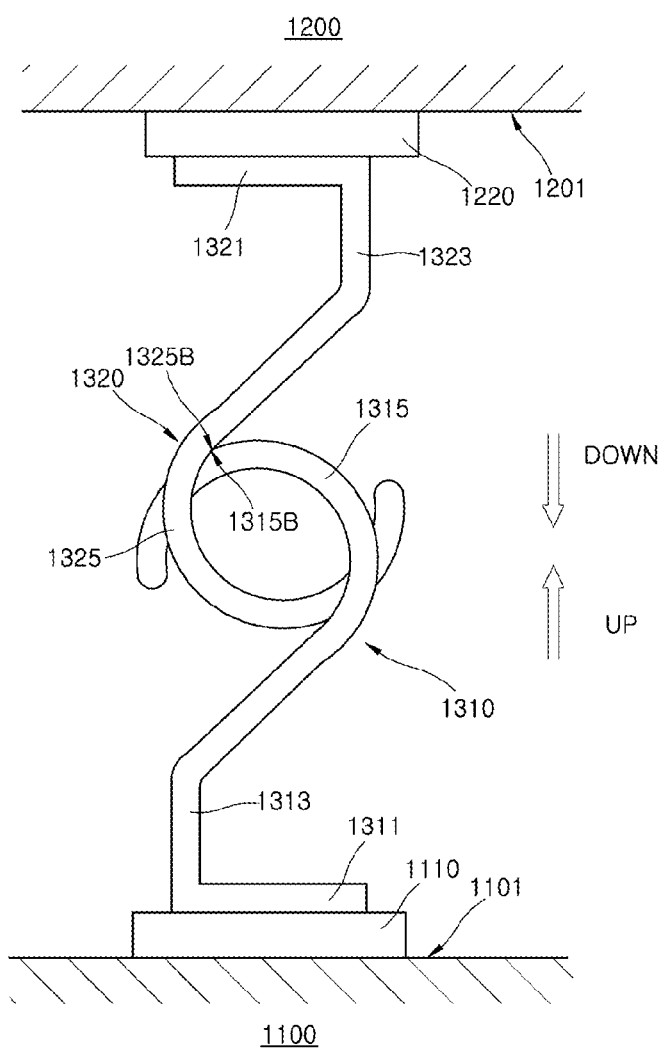

FIG. 14 is a cross-sectional view illustrating a representation of a semiconductor package 50 according to an embodiment. FIGS. 15 and 16 illustrate representations of examples of annular interconnection structures of FIG. 14.

Referring to FIG. 14, the semiconductor package 50 may include a stacked structure that a first substrate 1100 and a second substrate 1200 are stacked. The first and second substrate 1100 and 1200 may be electrically and signally connected to each other by annular interconnection structures, and each of the annular interconnection structures may include a first connection loop portion 1310 and a second connection loop portion 1320. As the first connection loop portion 1310 is hanged on and in contact with the second connection loop portion 1320, the first connection loop portion 1310 and the second connection loop portion 1320 may provide an electrical connection path between the first and second substrates 1100 and 1200.

The second substrate 1200 may be a wafer substrate including integrated circuits integrated by a semiconductor process, a semiconductor die, or a semiconductor chip. The first substrate 1100 may be a package substrate that a semiconductor die or chip is mounted thereon or embedded therein when the semiconductor die or chip is packaged in a semiconductor package by a packaging technology. The package substrate may be a printed circuit board (PCB). The second substrate 1200 may also be a wafer substrate including integrated circuits integrated by a semiconductor process, a semiconductor die or a semiconductor chip. In such a case, the semiconductor package 50 may be a stack package that a semiconductor chip is stacked on another semiconductor chip.

The semiconductor chip introduced as the first substrate 1100 or the second substrate 1200 may be fabricated to be thin so that the first and second substrates 1100 and 1200 may be warped or bent by the force provided by the external environment. A package substrate provided as the second substrate 1200 and the first substrate 1100 may be a flexible substrate that can be warped or bent.

Referring to FIGS. 14 and 15, first connection portions 1110 may be disposed on a surface 1101 of the first substrate 1100. The first connection portions 1110 may correspond to terminals electrically connecting the first substrate 1100 to external devices or other substrates. Each of the first connection portions 1110 may have a contact pad shape or a landing pad shape. Although not illustrated in the drawings, a circuit wiring structure including circuit wires and an insulating layer may be disposed between the first connection portions 1110 and the first substrate 1100 to provide an electrical path between the first connection portions 1110 and the first substrate 1100. The first connection portions 1110 may include a metal layer such as an aluminum (Al) layer, a copper (Cu) layer, or a tin (Sn) layer.

Second connection portions 1220 may be disposed on a surface 1201 of the second substrate 1200 staked to overlap with the first substrate 1100. The second substrate 1200 may be stacked over the first substrate 1100 so that the surface 1201 of the second substrate faces the surface 1101 of the first substrate 1100, and the second connection portions 1220 may be disposed on the surface 1201 of the second substrate 1200 so that the second connection portions 1220 are vertically aligned with the first connection portions 1110. The second connection portions 1220 may act as terminals electrically connecting the second substrate 1200 to the external devices or other substrates. Each of the second connection portions 1220 may have a contact pad shape or a landing pad shape. Although not illustrated in the drawings, a circuit wiring structure including circuit wires and an insulating layer may be disposed between the second connection portions 1220 and the second substrate 1200 to provide electrical paths between the second connection portions 1220 and the second substrate 1200. Each of the second connection portions 1220 may include a metal layer such as an Al layer, a Cu layer, or a Sn layer.

Each of the first connection loop portions 1310 may be provided so that its first end 1311 is combined with the first connection portion 1110. The first end 1311 of the first connection loop portion 1310 may be combined with a surface of the first connection portion 1110 so that the first connection loop portion 1310 is physically and mechanically connected to the first connection portion 1110. The first end 1311 of the first connection loop portion 1310 may be directly combined with the surface of the first connection portion 1110. Alternatively, the first end 1311 of the first connection loop portion 1310 may be combined with the surface of the first connection portion 1110 using a conductive adhesive layer (not illustrated). The conductive adhesive layer may be a conductive metal layer such as a solder material.

Each of the second connection loop portions 1320 may be provided so that its second end 1321 is combined with the second connection portion 1220. The second end 1321 of the second connection loop portions 1320 may be combined with a surface of the second connection portion 1220 so that second connection loop portions 1320 is physically and mechanically connected to the second connection portion 1220. The second end 1321 of the second connection loop portion 1320 may be directly combined with the surface of the second connection portion 1220. Alternatively, the second end 1321 of the second connection loop portion 1320 may be combined with the surface of the first connection portion 1220 using a conductive adhesive layer (not illustrated). The conductive adhesive layer may be a conductive metal layer such as a solder material.

Each of the first connection loop portion 1310 and the second connection loop portion 1320 may have a loop shape, a ring shape or a hook shape. Also, the first and the second connection loop portions 1310 and 1320 may be linked to have a chain shape.

Each of the first connection loop portions 1310 may include a first pillar portion 1313 vertically extending from the first end 1311 combined with the first connection portion 1110 and a first annular portion 1315 extending from the first pillar portion 1313 to have an annular shape. Each of the second connection loop portions 1320 may include a second pillar portion 1323 vertically extending form the second end 1321 combined with the second connection portion 1220 and a second annular portion 1325 extending from the second pillar portion 1323 to have an annular shape. The first annular portion 1315 or the second annular portion 1325 may have a hook shape rather than a circular ring shape of a closed curve.

The second annular portion 1325 may be hanged to the first annular portion 1315 so that the first connection loop portion 1310 and the second connection loop portion 1320 are connected to each other. The first annular portion 1315 and the second annular portion 1325 may be in direct contact with each other, but they are not fixed to each other. That is, the second annular portion 1325 may be flexible to move if an external force is applied thereto. Thus, the first connection loop portion 1310 may fluidly move with respect to the second connection loop portion 1320 in a certain range. The first connection loop portion 1310 or the second connection loop portion 1320 may be formed of a wire or a plate having an elasticity or a flexibility. For example, the first connection loop portion 1310 or the second connection loop portion 1320 may include Au, Ag or Cu.

Referring to FIGS. 14 and 15, when the position of the first substrate 1100 changes with respect to the second substrate 1200, the first annular portion 1315 of the first connection loop portion 1310 may move to slide up the second annular portion 1325 in a state that the first annular portion 1315 is hanged on to the second annular portion 1325. If shear stress is laterally applied to the first substrate 1100 so that the first connection portion 1110 is laterally shifted from an initial position 1110A while the second substrate 1200 does not move, that is, if the first substrate 1100 laterally moves with respect to the second substrate 1200, the first annular portion 1315 of the first connection loop portion 1310 can move in the annular loop of the second annular portion 1325 in a state hung to the second annular portion 1325 of the second connection loop portion 1320 while a part of the first contact surface 1315A is in contact with a part of the second contact surface 1325A of the second annular portion 1325. The contact position may be changed but the contact state may be maintained, and the relative position of the first annular portion 1315 with respect to the second annular portion 1325 may be changed. In accordance with this, even if the laterally relative position of the first substrate 1100 with respect to the second substrate 1200 is changed as the semiconductor package (10 of FIG. 14) is warped or bent, the relative position of the first annular portion 1315 with respect to the second annular portion 1325 is changed and the contact state between the first annular portion 1315 and the second annular portion 1325 may be maintained. Accordingly, the electrical connection between the first connection loop portion 1310 and the second connection loop portion 1320 may be maintained.

Referring to FIGS. 14 and 16 together, when the position of the first substrate 1100 is changed in the up and down directions with respect to the second substrate 1200, the first annular portion 1315 of the first connection loop portion 1310 may be fluid while keeping the state that the first annular portion 1315 is hung to the second annular portion 1325 of the second connection loop portion 1320. When the first substrate 1100 relatively moves up or the second substrate 1200 relatively moves down, the first annular portion 1315 of the first connection loop portion 1310 may move in the annular loop of the second annular portion 1325 while keeping the state that the first annular portion 1315 is hung to the second annular portion 1325 of the second connection loop portion 1320 and keeping the state that a part of the outer third contact surface 1325B is in contact with a part of the outer fourth contact surface 1315B of the second annular portion 1325. The contact position may be changed but the contact state may be maintained, and the relative position of the first annular portion 1315 with respect to the second annular portion 1325 may be changed. In accordance with this, even if the vertically relative position of the first substrate 1100 with respect to the second substrate 1200 is changed as the semiconductor package (10 of FIG. 14) is warped or bent, the relative position of the first annular portion 1315 with respect to the second annular portion 1325 is changed and the contact state between the first annular portion 1315 and the second annular portion 1325 may be maintained. Accordingly, the electrical connection between the first connection loop portion 1310 and the second connection loop portion 1320 may be maintained.

Referring back to the FIG. 14, as long as the state that the first connection loop portion 1310 and the second connection loop portion 1320 are hung to each other is maintained, the electrical connection structure of the first substrate 1100 with respect to the second substrate 1200 may be maintained though the relative position of the second substrate 1200 with respect to the first substrate 1100 is changed. Accordingly, even though the first substrate 1100 or the second substrate 1200 is bent or warped, as the first annular portion 1315 of the first connection loop portion 1310 can move in the second annular portion 1325 of the second connection loop portion 1320 to the displacement degree, therefore, the contact state between the first annular portion 1315 of the first connection loop portion 1310 and the second annular portion 1325 of the second connection loop portion 1320 may be maintained.

Figure 17:
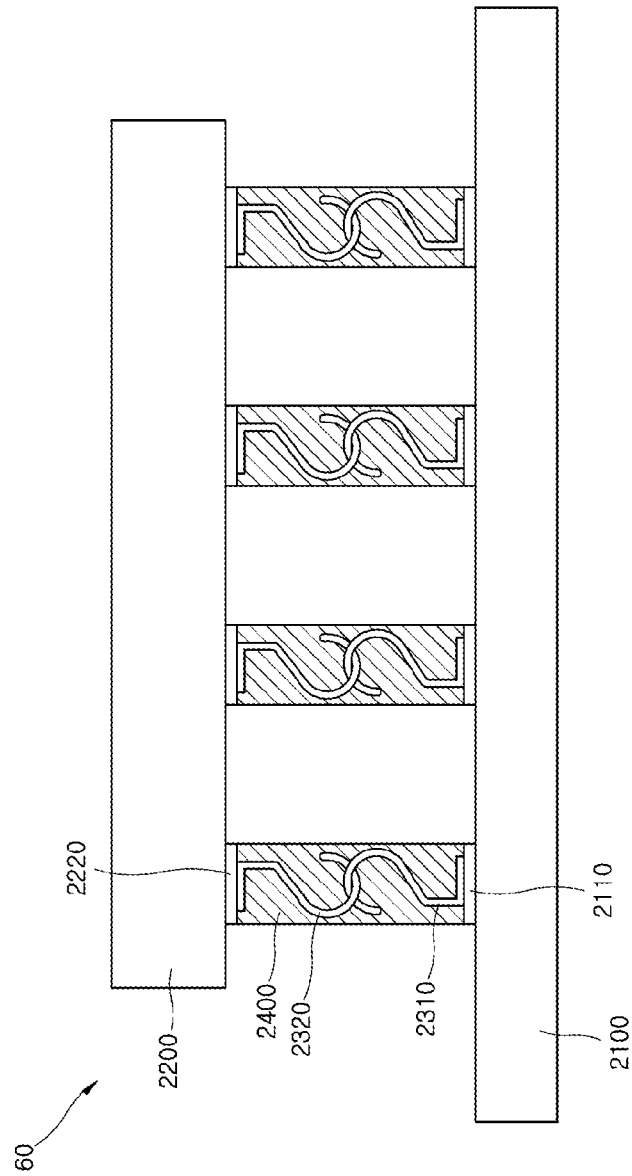
FIG. 17 is a cross-sectional view illustrating a representation of an example of a semiconductor package according to an embodiment.

FIG. 17 illustrates a representation of an example of a semiconductor package according to an embodiment.

Referring to FIG. 17, the semiconductor package 60 may include the structure that a second substrate 2200 including second connection portions 2220 is stacked over a first substrate 2100 including first connection portions 2110. The connection structure that electrically and signally connects the first substrate 2100 and the second substrate 2200 may include a first connection loop portion 2310 and a second connection loop portion 2320. As the first connection loop portion 2310 is hung to and contacts with the second connection loop portion 2320, the electrical path from the first connection loop portion 2310 to the second connection loop portion 2320 may be realized through the mutual contact portion.

In the state that the first connection loop portion 2310 is hung to the second connection loop portion 2320 and that the electrical connection path is formed, a covering layer 2400 covering the first connection loop portion 2310 and the second connection loop portion 2320 may be introduced. The covering layer 2400 may be introduced to keep the state that the first connection loop portion 2310 is hung to and contacts with the second connection loop portion 2320. The covering layer 2400 may include an insulation material, but may be introduced as a layer including a conductive material so as to improve the conductivity or the electrical flow from the first connection loop portion 2310 to the second connection loop portion 2320. The covering layer 2400 may include a layer that conductive particles are dispersed in matrix such as polymer or resin. The covering layer 2400 may be introduced as a layer having conductivity like a conductive polymer layer.

In the state that the second connection loop portion 2320 is fastened to the second connection portion 2220, and the first connection loop portion 2310 is hung to the second connection loop portion 2320, the covering layer 2400 may be formed by covering with a conductive polymer layer. The second substrate 2200 may be electrically connected to the first substrate 2100 by fastening the first connection loop portion 2310 covered with the covering layer 2400 to the first connection portion 2210.

Figure 18:
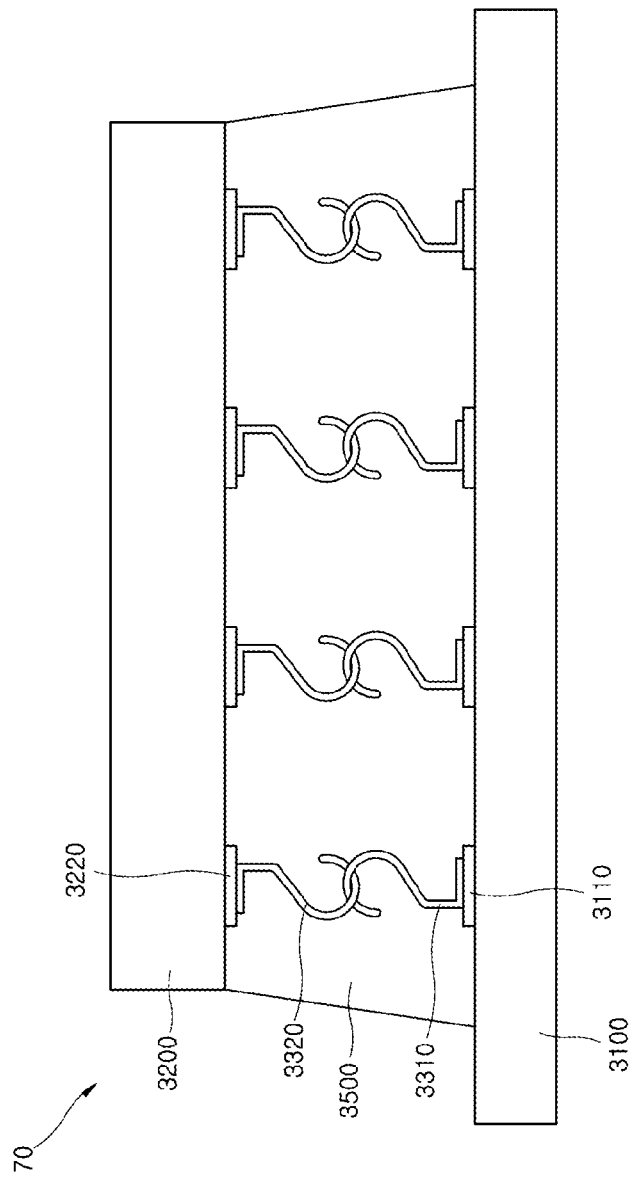
FIG. 18 is a cross-sectional view illustrating a representation of an example of a semiconductor package according to an embodiment.

FIG. 18 illustrates a representation of an example of a semiconductor package according to an embodiment.

Referring to FIG. 18, the semiconductor package 70 may include the structure that a second substrate 3200 including second connection portions 3220 is stacked over a first substrate 3100 including first connection portions 3110. The connection structure that electrically and signally connects the first substrate 3100 and the second substrate 3200 may include a first connection loop portion 3310 and a second connection loop portion 3320. As the first connection loop portion 3310 is hung to and contacts with the second connection loop portion 3320, the electrical path from the first connection loop portion 3310 to the second connection loop portion 3320 may be realized through the mutual contact portion.

In the state that the first connection loop portion 3310 is hung to the second connection loop portion 3320 and that the electrical connection path is formed, a buffer layer 3500 surrounding and impregnating the first connection loop portion 3310 and the second connection loop portion 3320 may be introduced between the first substrate 3100 and the second substrate 3200. The buffer layer 3500 may be introduced as a layer including a flexible dielectric material or a flexible insulation material. The buffer layer may be introduced as a flexible layer capable of fixing the solidarity of the first connection loop portion 3310 and the second connection loop portion 3320 and being warped together when the first substrate 3100 or the second substrate 3200 is warped. The buffer layer 3500 may include a material that has a Young's modulus of a range from 0.01 GPa to 0.1 GPa. The buffer layer 3500 may include a polymer material like polyimide. The buffer layer 3500 may include a layer of silicon resin, silicon rubber or silicon polymer. Although it is not illustrate, the first connection loop portion 3310 and the second connection loop portion 3320 may be introduced to be impregnated in the buffer layer 3500 in the state that covered with the covering layer (2400 of FIG. 17).

Figure 19:
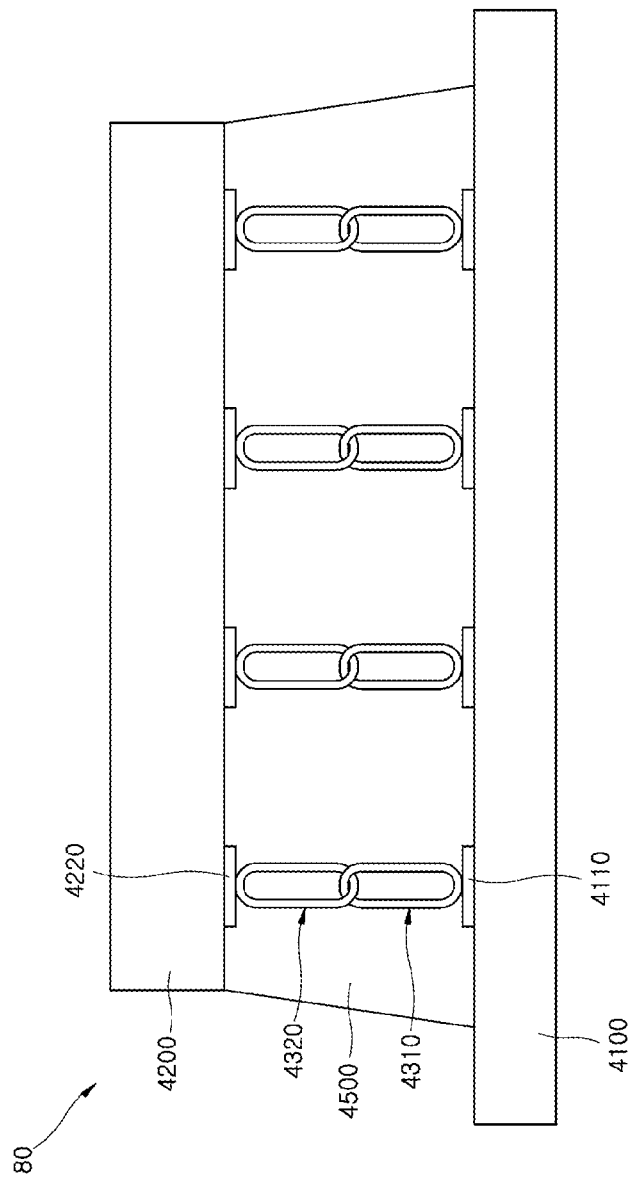
FIG. 19 is a cross-sectional view illustrating a representation of an example of a semiconductor package according to an embodiment.

FIG. 19 illustrates a representation of an example of a semiconductor package according to an embodiment.

Referring to FIG. 19, the semiconductor package 80 may include the stack structure that a second substrate 4200 including second connection portions 4220 is stacked over a first substrate 4100 including first connection portions 4110. The connection structure that electrically and signally connects the first substrate 4100 and the second substrate 4200 may include a first connection loop portion 4310 and a second connection loop portion 4320. As the first connection loop portion 4310 is hung to and contacts with the second connection loop portion 4320, the electrical path from the first connection loop portion 4310 to the second connection loop portion 4320 may be realized through the mutual contact portion.

The first connection loop portion 4310 and the second connection loop portion 4320 may have a shape of a circular ring, and may have a shape of a chain made of plaited rings. As the first connection loop portion 4310 may move horizontally and vertically in a state plaited to the second connection loop portion 4320, the electrical connection state may be maintained when the semiconductor package 80 is warped or bent. Although it is not illustrated, the first connection loop portion 4310 and the second connection loop portion 4320 may be impregnated in the buffer layer (3500 of FIG. 18), as illustrated in FIG. 18. In addition, though it is not illustrated, the first connection loop portion 4310 and the second connection loop portion 4320 may be introduced in a state covered by the covering layer (2400 of FIG. 17), as illustrated in FIG. 17. Also, though it is not illustrated, one or more additional rings may be formed to couple the first connection loop portion 4310 and the second connection loop portion 4320 to provide a shape of a chain with 3 or more loop portions including the first and second connection lop portions 4310 and 4320. In an embodiment, a third connection loop portion may couple the first connection loop portion 4310 to the second connection loop portion 4320 with or without the first connection loop poring 4310 being directly coupled to the second connection loop portion 4320.

Figure 20:
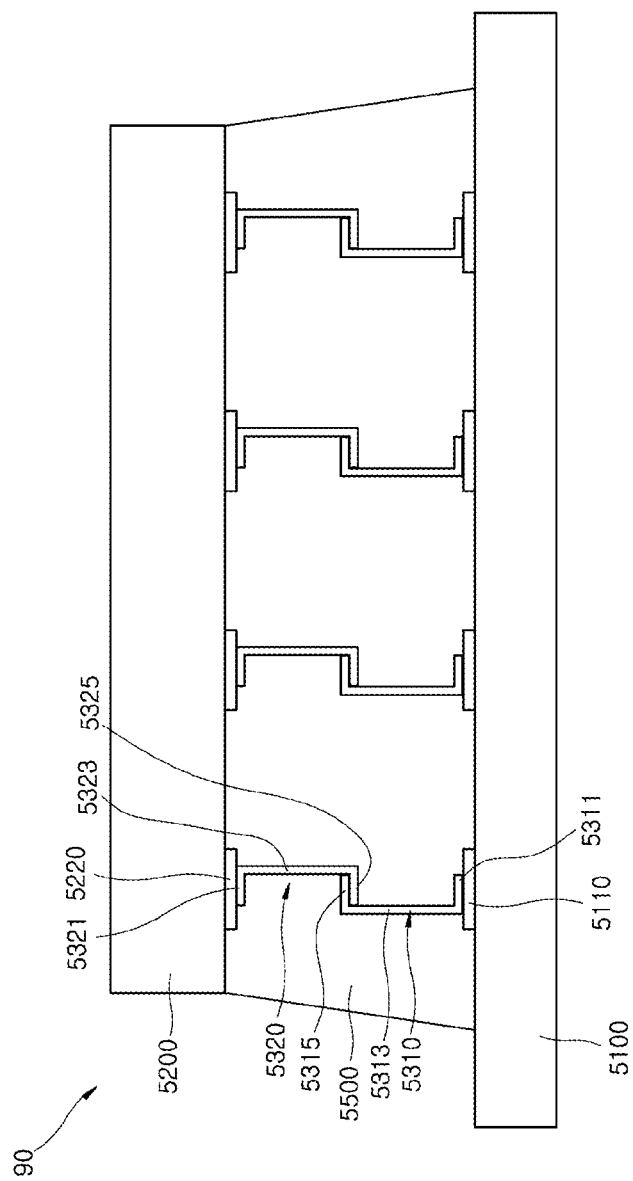
FIG. 20 is a cross-sectional view illustrating a representation of an example of a semiconductor package according to an embodiment.

FIG. 20 illustrates a representation of an example of a semiconductor package according to an embodiment.

Referring to FIG. 20, the semiconductor package 90 may include the structure that a second substrate 5200 including second connection portions 5220 is stacked over a first substrate 5100 including first connection portions 5110. The connection structure that electrically and signally connects the first substrate 5100 and the second substrate 5200 may include a first connection loop portion 5310 and a second connection loop portion 5320. As the first connection loop portion 5310 is hung to and contacts with the second connection loop portion 5320, the electrical path from the first connection loop portion 5310 to the second connection loop portion 5320 may be realized through the mutual contact portion.

The first connection loop portion 5310 may include a first pillar portion 5313 substantially vertically extending from the first end 5311 that is fastened to the first connection portion 5110 and a first hook portion 5315 laterally extending from the first pillar portion 5313. As the first connection loop portion 5310 has a shape of alphabet "C", the first connection loop portion 5310 may have a shape providing flexibility. The second connection loop portion 5320 may include a second pillar portion 5323 substantially vertically extending from the second end 5321 that is fastened to the second connection portion 5220, and a second hook portion 5325 laterally extending from the second pillar portion 5323 and contacting with the first hook portion 5315. As the second connection loop portion 5320 has a mirror image of alphabet "C", the second connection loop portion 5320 may have a shape providing flexibility.

As the first connection loop portion 5310 and the second connection loop portion 5320 may move in the state that they are hooked each other, the electrical connection state may be maintained when the semiconductor package 90 is warped or bent. Although it is not illustrated, the first connection loop portion 5310 and the second connection loop portion 5320 may be impregnated in the buffer layer (3500 of FIG. 18), as illustrated in FIG. 18. In addition, though it is not illustrated, the first connection loop portion 5310 and the second connection loop portion 5320 may be introduced in the state covered with the covering layer 2400 of FIG. 17, as illustrated in FIG. 17.

Figure 21:
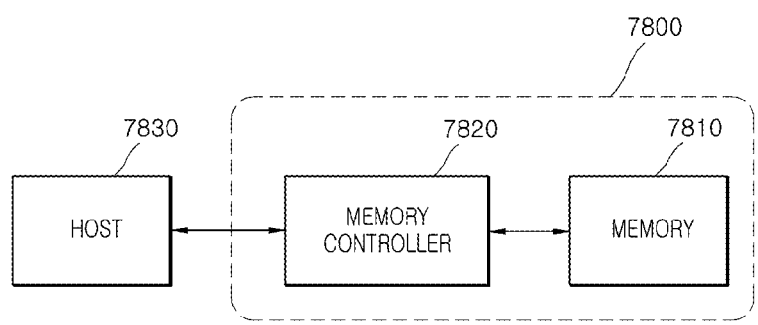
FIG. 21 is a block diagram illustrating a representation of an example of an electronic system employing a memory card including a package in accordance with an embodiment.

FIG. 21 is a block diagram illustrating a representation of an example of an electronic system including a memory card 7800 including at least one semiconductor package according to an embodiment. The memory card 1800 includes a memory 7810, such as a nonvolatile memory device, and a memory controller 7820. The memory 7810 and the memory controller 7820 may store data or read stored data. The memory 7810 and/or the memory controller 7820 include one or more semiconductor chips disposed in an embedded package according to an embodiment.

The memory 7810 may include a nonvolatile memory device to which the technology of the embodiments of the present disclosure are applied. The memory controller 7820 may control the memory 7810 such that stored data is read out or data is stored in response to a read/write request from a host 7830.

Figure 22:
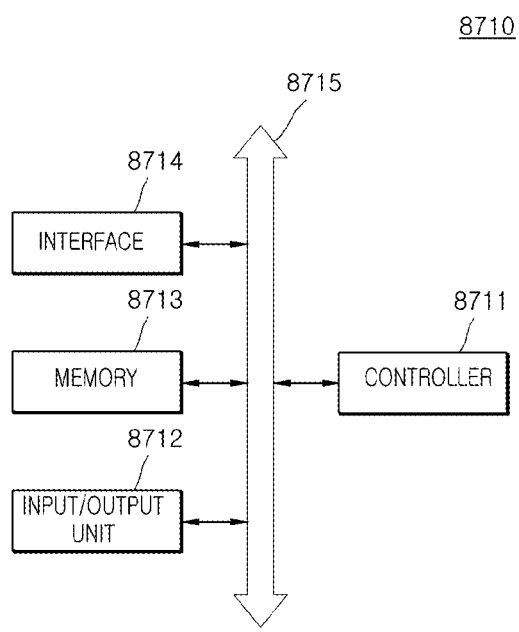
FIG. 22 is a block diagram illustrating a representation of an example of an electronic system including a package in accordance with an embodiment.

FIG. 22 is a block diagram illustrating a representation of an example of an electronic system 8710 including at least one package according to an embodiment. The electronic system 8710 may include a controller 8711, an input/output device 8712, and a memory 8713. The controller 8711, the input/output device 8712 and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system such as of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) and Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor package comprising:
   a first substrate including a first connection pad disposed on a surface of the first substrate;
   a second substrate including a second connection pad disposed on a surface of the second substrate, wherein the second substrate is disposed over the first substrate and the second connection pad facing the first connection pad;
   a first interconnection member including a first pillar portion vertically extending from the second connection pad toward the first substrate, a portion providing a first curved surface extending from the first pillar portion and concavely bent, a first bending portion extending from the portion providing the first curved surface toward the first pillar portion direction, and a portion providing a first hook surface horizontally extending from the first bending portion toward an inner space of the portion providing the first curved surface; and
   a second interconnection member including a second pillar portion vertically extending from the first connection pad toward the second substrate, a portion providing a second curved surface extending from the second pillar portion and concavely bent, and a portion providing a second hook surface horizontally extending from the portion providing the second curved surface to contact the portion providing the first hook surface of the first interconnection member.

2. The semiconductor package of claim 1, wherein the second substrate further includes:
   a body; and
   a re-distribution layer disposed between the body and the second connection pad,
   wherein the re-distribution layer includes an inner wiring pattern and a via electrode disposed within the re-distribution layer.

3. The semiconductor package of claim 1, wherein the first substrate is a printed circuit board (PCB).

4. The semiconductor package of claim 1, wherein at least one of the first interconnection member and the second interconnection member includes a material capable of being warped or transformed when an external force is applied.

5. The semiconductor package of claim 1, wherein at least one of the first interconnection member and the second interconnection member includes one of gold (Au), silver (Ag) and copper (Cu).

6. The semiconductor package of claim 1, wherein at least one of the first interconnection member and the second interconnection member is provided using a plate type member.

7. The semiconductor package of claim 1, wherein a vertical cross-sectional shape of a portion comprised of the portion providing the first curved surface, the first bending portion, and the portion providing the first hook surface of the first interconnection member has a shape of an alphabet "G".

8. The semiconductor package of claim 1, wherein a vertical cross-sectional shape of a portion comprised of the second pillar portion, the portion providing the second curved surface, and the portion providing the second hook surface has a shape of a letter "ㄱ".

9. The semiconductor package of claim 1,
   wherein the second interconnection member further includes a second bending portion vertically extending from the portion providing the second hook surface toward the first substrate; and
   wherein the second bending portion is in contact with a sidewall of the first hook surface of the first interconnection member.

10. The semiconductor package of claim 9, wherein the second interconnection member has a "7"-shaped vertical cross-section.

11. The semiconductor package of claim 1,
    wherein a space between the first substrate and the second substrate is filled with a buffer layer including a flexible material; and
    wherein the flexible material has a Young's modulus of about 0.01 GPa to about 0.1 GPa.

12. The semiconductor package of claim 11, wherein the flexible material includes one of silicone resin, silicone rubber and polymer.

13. The semiconductor package of claim 1,
    wherein the first hook surface includes a first side surface facing towards the first curved surface,
    wherein the second hook surface includes a second side surface vertically aligned with the first side surface.

* * * * *